United States Patent [19]

Brunner

[11] Patent Number: 5,981,979
[45] Date of Patent: Nov. 9, 1999

[54] RADIATION-EMITTING SEMICONDUCTOR COMPONENT

[75] Inventor: Herbert Brunner, Regensburg, Germany

[73] Assignee: Siemens Aktiengesellschaft, Munich, Germany

[21] Appl. No.: 08/979,535

[22] Filed: Nov. 26, 1997

[30] Foreign Application Priority Data

Nov. 29, 1996 [DE] Germany .......................... 196 49 650

[51] Int. Cl.[6] .................................................. H01L 33/00
[52] U.S. Cl. .............................. 257/99; 257/100; 257/696
[58] Field of Search ................................ 257/98, 99, 100, 257/666, 676, 696

[56] References Cited

U.S. PATENT DOCUMENTS 5,187,547  2/1993  Niina et al. .............................. 257/99

*Primary Examiner*—Minh Loan Tran
*Attorney, Agent, or Firm*—Herbert L. Lerner; Laurence A. Greenberg

[57] ABSTRACT

A surface-mountable radiation-emitting semiconductor component includes an integrally constructed sheath of radiation-permeable material. The sheath has mutually opposite sides with a bottom surface and a radiation exit surface. The sheath also has a PCB bearing surface which is substantially perpendicular to the bottom surface and is located in one and the same plane as soldering surfaces of terminal leads protruding through the bottom surface out of the sheath.

15 Claims, 3 Drawing Sheets

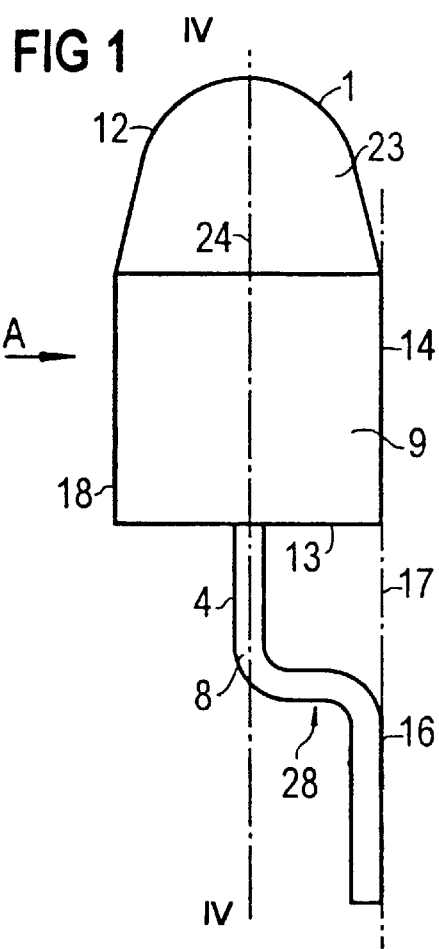
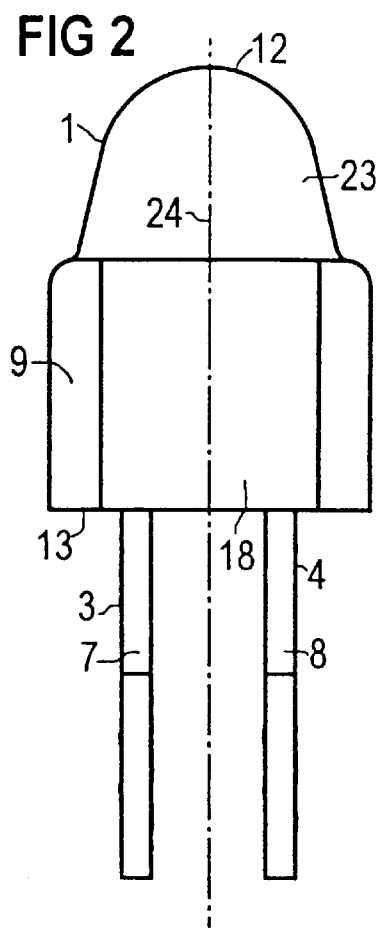
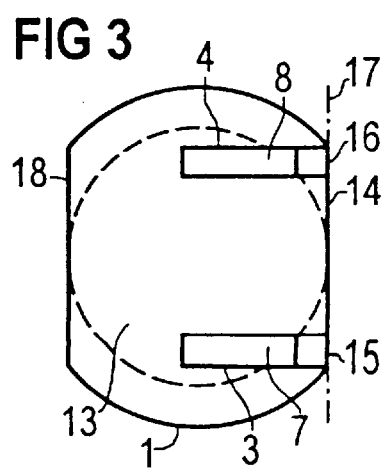
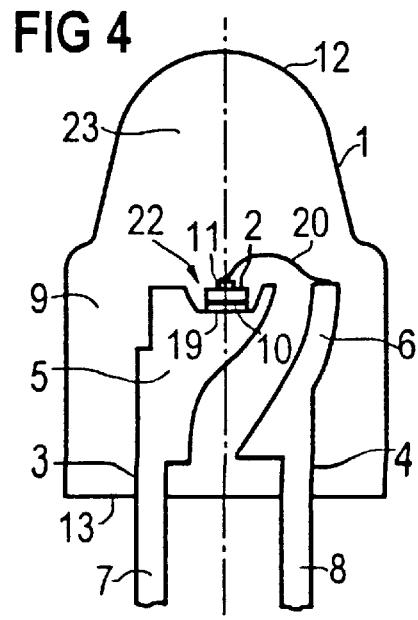

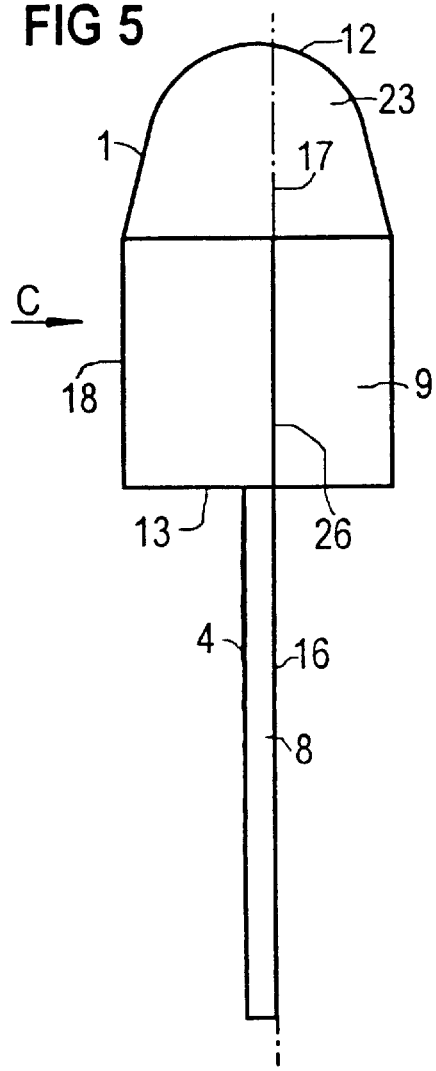
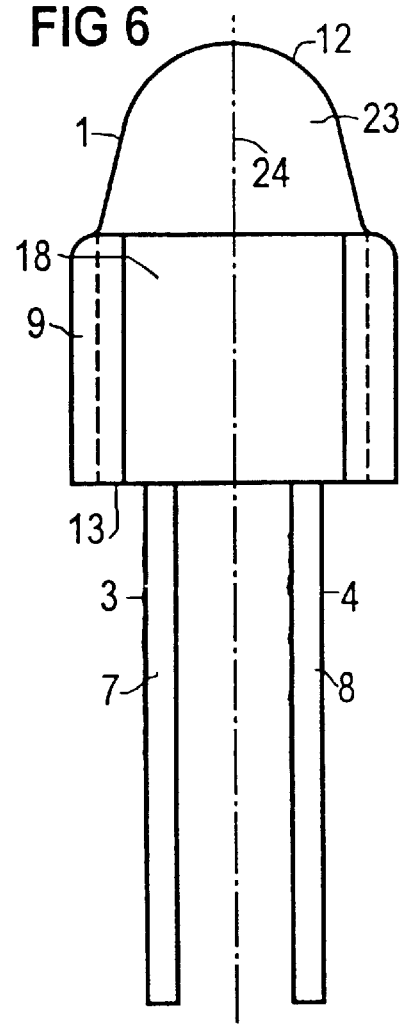
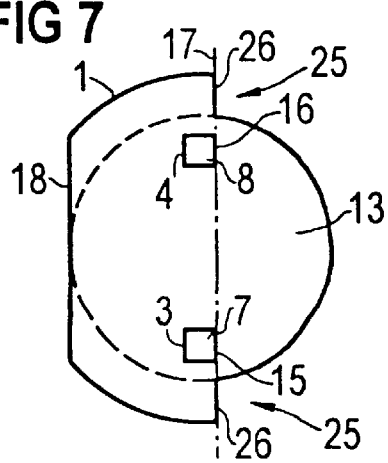
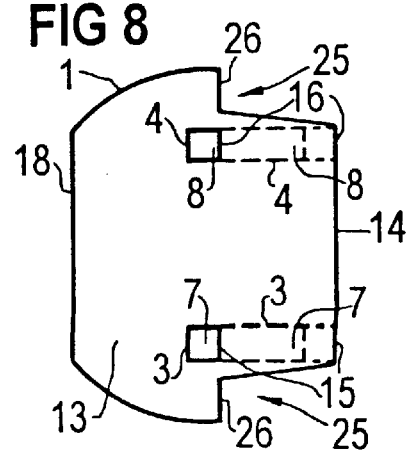

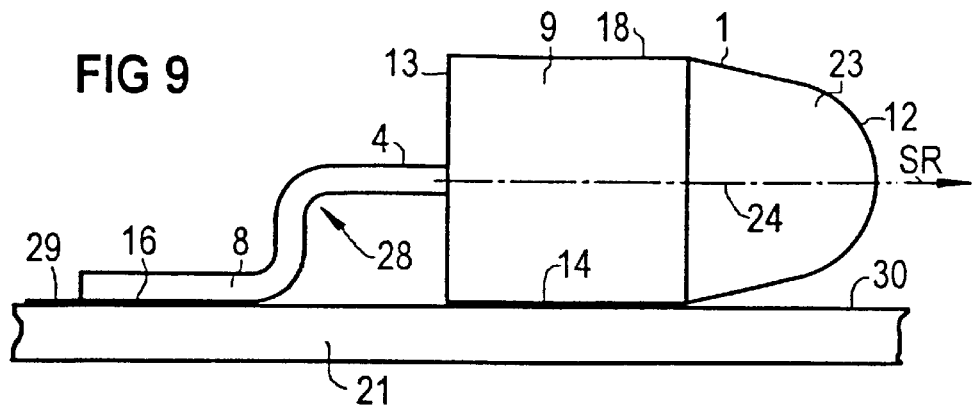
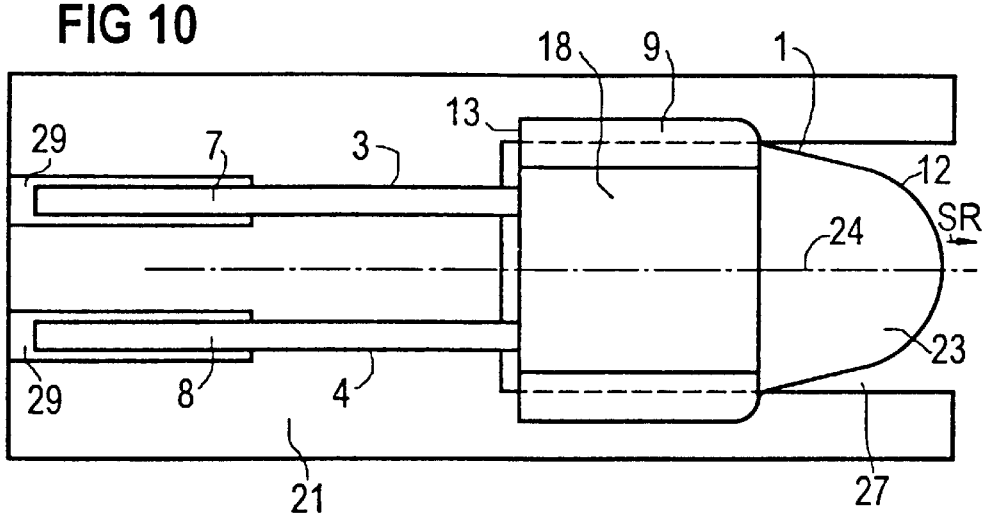
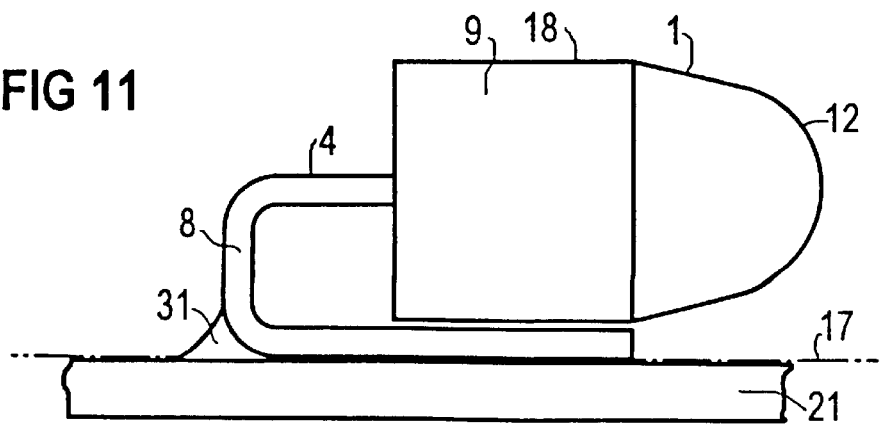

RADIATION-EMITTING SEMICONDUCTOR COMPONENT

BACKGROUND OF THE INVENTION

Field of the Invention

The invention relates to a radiation-emitting semiconductor component which transmits a cone of radiation along an optical axis, including at least one semiconductor body transmitting radiation, a first electrical terminal part having a first head part and a first terminal lead, a second electrical terminal part having a second head part and a second terminal lead, and an integral sealing sheath, in particular formed integrally through the use of a casting technique from a material, especially plastic, that is at least partly permeable to the radiation, a first electrical contact of the semiconductor body being electrically conductively connected to the first head part, a second electrical contact of the semiconductor body being electrically conductively connected to the second head part, the sealing sheath enclosing the semiconductor body and the first and second head parts, the sealing sheath having a radiation exit surface and a bottom surface disposed on opposite sides of the sealing sheath, and the first and second terminal leads protruding through the bottom surface out of the sealing sheath.

The invention relates in particular to semiconductor components that emit infrared radiation (such as IR light emitting diodes or LEDs), for instance for use in infrared remote controls for television sets and radios, video recorders, light dimmers, etc., for remote controls for appliances, and for electric eyes for direct and alternating light operation, and light emitting diodes that emit visible light.

Such semiconductor components are available on the market and are described, for instance, in the Siemens brochure entitled "Lumineszenzdioden Qualitat und Zuverlassigkeit" [Light-Emitting Diodes Quality and Reliability], subject document 09.90, published by Siemens AG, Semiconductor Division, Marketing Communications, Munich, January 1991, and in the Siemens Shipment Program 07.94, entitled "Optohalbleiter und Sensoren" [Optical Semiconductor and Sensors], published by Siemens AG, Semiconductor Division, Marketing Communications, Munich, pp. 18–33. Mounting such semiconductor components on a PCB (printed circuit board) in a circuit configuration is performed by inserting the terminal parts, which are constructed as solder spikes, through bores in the PCB and then soldering them. However, because of the fact that today nearly all other electronic components are constructed to be surface-mountable, that entails especially great additional mounting expense. Surface mounting technology, which is also known as SMT, is a familiar method in semiconductor technology for securing semiconductor elements and will therefore not be described in further detail herein.

In a surface mountable LED unit which is known from German Published, Non-Prosecuted Patent Application DE 44 41 477 A1, a conventional so-called radial LED is inserted into a sleeve-like plastic housing with a protrusion forming a bearing surface and with a centering pin and recesses for receiving ends of electrical terminals. Producing such components entails relatively major technological effort and expense, especially since the dimensions of the plastic sheath and of the sleeve-like plastic housing cannot be allowed to have overly great tolerances, if a sufficiently accurate fit of the two parts is to be attained.

SUMMARY OF THE INVENTION

It is accordingly an object of the invention to provide a surface-mountable radiation-emitting semiconductor component, which overcomes the hereinafore-mentioned disadvantages of the heretofore-known devices of this general type, which is technically simple to produce and which permits a low structural height when mounted on a printed circuit board (PCB). The component should also be equipped with an additional optical element for the radiation that is emitted and should have a high radiation intensity at a minimum acceptable half angle of 15 to 20°.

With the foregoing and other objects in view there is provided, in accordance with the invention, a radiation-emitting semiconductor component transmitting a cone of radiation, comprising at least one semiconductor body having electrical contacts and transmitting radiation along an optical axis of the semiconductor component; a first electrical terminal part having a first head part and a first terminal lead with a first soldering surface in a given plane, the first head part electrically conductively connected to one of the electrical contacts; a second electrical terminal part having a second head part and a second terminal lead with a second soldering surface in the given plane, the second head part electrically conductively connected to another of the electrical contacts; and an integral sealing sheath formed of a material at least partly permeable to the radiation and enclosing the semiconductor body and the first and second head parts, the sealing sheath having mutually opposite radiation exit and bottom surfaces, the first and second terminal leads protruding through the bottom surface out of the sealing sheath, the sealing sheath having at least one substantially flat PCB bearing surface substantially in the given plane, the PCB bearing surface being inclined relative to the bottom surface and in particular perpendicular thereto, and the given plane and the optical axis forming an acute angle or extending parallel.

The housing formed by the sheath and the electrical terminal parts can thus be surface-mounted on a PCB in a simple way. The soldering surfaces and the PCB bearing surfaces assure that the component will be seated stably on the PCB.

The concept of being located substantially in the same plane with the PCB bearing surface expresses the fact that the soldering surfaces may also be disposed slightly offset from the PCB bearing surface. Despite the offset, secure contacting of the terminal leads on associated conductor tracks of the PCB must be assured. SMT methods which are known per se are employed in order to mount the semiconductor component on a PCB. For instance, the sealing sheath may first be glued to the PCB at the PCB bearing surface, and then the terminal leads may be soldered to the associated conductor tracks.

In accordance with another feature of the invention, the first and second head parts are located in a plane that is offset, and in particular shifted parallel, from the PCB bearing surface, and the first and second terminal leads each have one S-shaped bend. This bend is formed in such a way that the first and second soldering surfaces and the PCB bearing surface are located substantially in the same plane. In this case the PCB bearing surface is made particular by laterally flattening the sealing sheath. Such a semiconductor component according to the invention can be seated stably on the surface of a PCB and secured there in a simple way.

In accordance with a further feature of the invention, the PCB bearing surface is formed by one or two lateral inward bulges in the sealing sheath, the terminal leads are rectilinear, and one side surface of each of the first and second terminal leads having the respective soldering surfaces and the PCB bearing surface are located substantially in the same plane. When there are two lateral inward bulges, they are preferably located on sides of the sealing sheath facing one another.

In accordance with an added feature of the invention, the two head parts are also located in the same plane, that is in the mounting plane.

A corresponding PCB onto which such a semiconductor component of the invention can be mounted has a recess in which the sheath is partly countersunk. This mode of construction advantageously makes it possible to construct a PCB with an especially low structural height.

In accordance with an additional feature of the invention, the sealing sheath has a flat intake or aspiration surface opposite the PCB bearing surface. In particular, this has the advantage of permitting the semiconductor component of the invention to be mounted on the PCB by using conventional assembly robots with a suction pipette.

In accordance with yet another feature of the invention, the radiation exit surface of the sealing sheath is curved in such a way that it acts as a lens for the radiation emitted by the semiconductor body.

In accordance with yet a further feature of the invention, the sealing sheath, on the side opposite the bottom surface, is provided with a cap-shaped lens, which has a curved radiation exit surface and an optical axis that coincides with the optical axis of the radiation-emitting semiconductor body. A very high radiation intensity of the semiconductor component is advantageously attainable through the use of such an embodiment.

With the objects of the invention in view, there is also provided a radiation-emitting semiconductor component, comprising at least one semiconductor body transmitting a cone of radiation along an optical axis of the semiconductor component and having first and second electrical contacts; a first electrical terminal part having a first head part and a first terminal lead with a first soldering surface in a given plane, the first head part electrically conductively connected to the first electrical contact; a second electrical terminal part having a second head part and a second terminal lead with a second soldering surface in the given plane, the second head part electrically conductively connected to the second electrical contact; and an integral sealing sheath formed of a material at least partly permeable to the radiation and enclosing the semiconductor body and the first and second head parts, the sealing sheath having opposite sides and radiation exit and bottom surfaces each disposed at a respective one of the opposite sides, the first and second terminal leads protruding through the bottom surface out of the sealing sheath, the sealing sheath having two lateral inward bulges forming a first PCB bearing surface and one lateral flat surface forming a second PCB bearing surface, one of the PCB bearing surfaces selectively disposed in the given plane depending on the type of mounting of the component; whereby the sealing sheath and the electrical terminal parts form a housing to be surface-mounted on a PCB.

This has the advantage of permitting semiconductor components with one and the same sheath to be optionally mounted on a PCB with a recess for the sheath or on a flat PCB. In the choice of the second PCB bearing surface, all that is necessary before mounting is that the terminal leads be suitably bent in an S.

With the objects of the invention in view, there is additionally provided a radiation-emitting semiconductor component, comprising at least one semiconductor body transmitting radiation and having first and second electrical contacts; a first electrical terminal part having a first head part and a first terminal lead with a side surface, the first head part electrically conductively connected to the first electrical contact; a second electrical terminal part having a second head part and a second terminal lead with a side surface, the second head part electrically conductively connected to the second electrical contact; and a sealing sheath formed integrally from a material at least partly permeable to the radiation and enclosing the semiconductor body and the first and second head parts, the sealing sheath having opposite sides and radiation exit and bottom surfaces each disposed at a respective one of the opposite sides; the first and second terminal leads protruding through the bottom surface out of the sealing sheath, the first and second terminal leads having a U-shaped bend outside the sealing sheath defining length portions of the terminal leads extending along the sealing sheath and along the optical axis toward the radiation exit surface, and the side surfaces disposed in a common plane in the vicinity of the length portions.

In accordance with another feature of the invention, the sealing sheath has an intake or aspiration surface in the form of a flattened surface along the optical axis on its side opposite the common plane.

In accordance with a further feature of the invention, the sheath has a flattened surface on the side on which the terminal leads extend, in order to reduce the structural height of the semiconductor component.

In accordance with a concomitant feature of the invention, the radiation exit surface at the side of the sheath opposite the bottom surface is curved, a cap-shaped lens is disposed at the radiation exit surface, the at least one semiconductor body has an optical axis, and the lens has an optical axis coinciding with the optical axis of the at least one semiconductor body.

Other features which are considered as characteristic for the invention are set forth in the appended claims.

Although the invention is illustrated and described herein as embodied in a radiation-emitting semiconductor component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a diagrammatic, side-elevational view of a first exemplary embodiment of a semiconductor component of the invention;

FIG. 2 is a further diagrammatic, side-elevational view of the first exemplary embodiment, as is seen from a side indicated by an arrow A in FIG. 1;

FIG. 3 is a plan view of a bottom surface of the first exemplary embodiment;

FIG. 4 is a fragmentary, sectional view of the first exemplary embodiment, which is taken along a line IV—IV of FIG. 1;

FIG. 5 is a diagrammatic, side-elevational view of a second exemplary embodiment of a semiconductor component of the invention;

FIG. 6 is a further diagrammatic, side-elevational view of the second exemplary embodiment, as is seen from a side indicated by an arrow C in FIG. 5;

FIG. 7 is a plan view of a bottom surface of the second exemplary embodiment;

FIG. 8 is a plan view of a bottom surface of a third exemplary embodiment;

FIG. 9 is a fragmentary, side-elevational view of a semiconductor component of the first exemplary embodiment of the invention, which is mounted on a PCB;

FIG. 10 is a side-elevational view of a semiconductor component of the second exemplary embodiment of the invention, which is mounted on a PCB; and FIG. 11 is a fragmentary, side-elevational view of a fourth exemplary embodiment of the invention.

DESCRIPTION OF THE PREFERRED EMBODIMENTS

Referring now to the figures of the drawings in detail and first, particularly, to FIGS. 1–4 thereof, there is seen a semiconductor component having a first head part 5 of a first terminal part 3 and a second head part 6 of a second terminal part 4 which are enclosed by an integrally constructed plastic sheath 1 that has a base body 9 and a cap-shaped lens 23. The terminal parts 3, 4 are formed of an electrically conductive material, such as a conventional metal used for leadframes. A first terminal lead 7 of the first terminal part 3 and a second terminal lead 8 of the second terminal part 4 begin at the respective associated head part 5, 6 and protrude through a flat bottom surface 13 of the base body 9 out of the plastic sheath 1. A reflector well 22 with a chip carrier surface 19 is formed on the first head part 5. A semiconductor body 2 that emits radiation, for instance an IR LED chip or an LED chip that emits visible light, is disposed on the well 22. The plastic sheath 1 is made by a casting technique from a plastic, such as epoxy resin, that is at least partly permeable to radiation. Diffusor particles or luminescence conversion substances, which influence the radiating characteristic of the semiconductor component or the color of the radiated light, may be added to the plastic.

The semiconductor body 2 has a back contact metalization 10 on the back of the chip and a front contact metalization 11 on the front of the chip, which are electrically conductively connected to the chip carrier or mounting surface 19 or the second head part 6 in the usual way through the use of a metal solder or a bond wire 20.

The cap-shaped lens 23 is disposed on a side of the base body 9 opposite the bottom surface 13 and is located in the radiation direction of the radiation-emitting semiconductor body 2. The cap-shaped lens 23 may have a spherical or aspherical radiation exit surface 12, or a radiation exit surface provided with variously curved regions. A cross section of the base body 9 located parallel to the bottom surface 13 is constructed to be substantially circular, but in principle it may have any other arbitrary shape. Optical axes 24 of the radiation-emitting semiconductor body 2 and of the cap-shaped lens 23 coincide. The position of the radiation-emitting semiconductor body 2 in the plastic sheath 1 is selected in such a way that substantially all of the radiation emitted by the semiconductor body 2 is outcoupled out of the plastic sheath 1, through the radiation exit surface 12 of the cap-shaped lens 23.

The plastic sheath 1 also has two flattened housing surfaces which face one another and are located parallel to the optical axis 24 of the semiconductor body 2. One of the surfaces represents an intake surface 18 and the other represents a PCB (printed circuit board) bearing surface 14. The terminal leads 7, 8 protrude through the bottom surface 13 out of the plastic sheath 1 approximately centrally between these two flattened housing surfaces. Outside the plastic sheath 1, the terminal leads 7, 8 are bent initially by 90° in the direction of the PCB bearing surface 14 and are bent back in their further course by 90° into their original direction of extension. Accordingly, the terminal leads 7, 8 have an S-shaped bend 28, so that one portion of each of two side surfaces, which are referred to below as first and second soldering surfaces 15, 16, of each of the terminal leads 7, 8 is located approximately in the same plane 17 as the PCB bearing surface 14 of the plastic sheath 1. The optical axis 24 of the semiconductor component accordingly extends substantially parallel to its mounting plane, which is defined by the PCB bearing surface 14 and the soldering surfaces 15, 16.

The exemplary embodiment of the radiation-emitting semiconductor component of the invention which is diagrammatically shown in FIGS. 5–7, is distinguished from that described above in particular in that the terminal leads 7, 8 outside the plastic sheath 9 extend in rectilinear fashion or in other words have no bend and are located substantially in one and the same plane, and in that two inward bulges 25 which are perpendicular to the bottom surface 13 are provided on opposed sides of the base body 9 of the plastic sheath 9 as the PCB bearing surface, instead of a flattened surface. Through the use of these inward bulges 25, flat surfaces 26 are formed that are perpendicular to the bottom surface 13, are substantially in the same plane 17 as the terminal leads 7, 8, and extend over the entire length of the base body 9. The first head part 5 and the second head part 6 are likewise located substantially in the same plane 17 in this case.

A semiconductor component which is constructed in this way, as is shown in FIG. 10, is intended for mounting onto a PCB 21 that has a recess 27 for countersinking the plastic sheath 1.

The flat surfaces 26 form a PCB bearing surface and rest on the PCB 21 at an edge of the recess 27. The terminal leads 7, 8 likewise rest on the PCB 21 and are joined to conductor tracks 29, for instance through the use of a metal solder. This type of mounting advantageously assures a very low structural height of the corresponding circuit configuration, and at the same time assures simple geometry of the PCB 21.

In comparison, as is shown in FIG. 9, the exemplary embodiment described in conjunction with FIGS. 1–4 is suitable for mounting on a flat PCB 21, in which a radiation direction SR of the semiconductor component extends parallel to an upper surface 30 of the PCB 21.

As is shown in FIG. 8, the base body 9 of the plastic sheath 1 may at the same time have not only a PCB bearing surface 14 as in the exemplary embodiment described first in conjunction with FIGS. 1–4 but may also two flat surfaces 26 formed by lateral inward bulges 25, in accordance with the exemplary embodiment described in conjunction with FIGS. 5–7 This has the advantage of permitting the corresponding semiconductor component of the invention to be selectively mounted on a corresponding PCB 21 in the way shown in FIG. 9 or in the way shown in FIG. 10, without having to modify the plastic sheath 1. Depending on the type of mounting intended, the terminal leads 7, 8 should either be left straight or should be provided with corresponding bends 28 as in the first exemplary embodiment described above.

In the semiconductor component of the invention shown in FIG. 11, the terminal leads 7, 8, outside the plastic sheath 1, are bent twice by 90° in the same direction, thus producing a length portion of each of the two terminal leads 7, 8 that extends along the base body 9 parallel to the optical axis 24 in the direction of the cap-shaped lens 23. Side surfaces of these portions which face away from the plastic sheath 1, are located substantially in the same plane. In order to mount this semiconductor component on a PCB 21, it is placed with these side surfaces on the PCB 21 and then secured to it through the use of an electrically conductive joining agent 31, such as a metal solder.

In this semiconductor component of the invention as well, the plastic sheath 1 has an intake surface 18 on its side facing away from the PCB 21. The plastic sheath 1 may also have a flattened surface, on the side facing toward the PCB, in order to reduce the structural height of the semiconductor component.

The housing structure of the invention as described above, when provided with a suitable IR-luminescent semiconductor body, can be especially advantageously used in IR remote controls and in electric eyes. It is also advantageously suitable for semiconductor components that emit visible light or UV radiation. The mounting effort and expense for the semiconductor components of the invention is markedly reduced, as compared with conventional radiation-emitting semiconductor components with a so-called radial construction.

It is understood that the invention is not limited to the exemplary embodiments described above but rather encompasses all possible housing constructions that can be inferred from the above description by one skilled in the art and that have the characteristics disclosed in the claims or are equivalent to those characteristics. For instance, the terminal leads 7, 8 may also be constructed in such a way that they protrude out of the sheath 9 while extending not parallel but rather perpendicular to the optical axis 24 of the semiconductor component.

I claim:

1. A radiation-emitting semiconductor component, comprising:

at least one semiconductor body having electrical contacts and transmitting radiation along an optical axis of the semiconductor component;

a first electrical terminal part having a first head part and a first terminal lead with a first soldering surface in a given plane, said first head part electrically conductively connected to one of said electrical contacts;

a second electrical terminal part having a second head part and a second terminal lead with a second soldering surface in said given plane, said second head part electrically conductively connected to another of said electrical contacts; and an integral sealing sheath formed of a material at least partly permeable to the radiation and enclosing said semiconductor body and said first and second head parts, said sealing sheath having mutually opposite radiation exit and bottom surfaces and at least one substantially flat PCB bearing surface substantially in said given plane, said first and second terminal leads protruding through said bottom surface out of said sealing sheath, said terminal leads each having a side surface with a respective one of said first and second soldering surfaces, and each terminal lead having an S-shaped bend toward said given plane, placing said side surfaces in said given plane, and said first and second head parts disposed in a plane offset from said PCB bearing surface.

2. The radiation-emitting semiconductor component according to claim 1, wherein said semiconductor body transmits a cone of radiation.

3. The radiation-emitting semiconductor component according to claim 1, wherein said given plane and said optical axis form an acute angle.

4. The radiation-emitting semiconductor component according to claim 1, wherein said given plane and said optical axis extend parallel.

5. The radiation-emitting semiconductor component according to claim 4, wherein said plane of said first and second head parts is shifted parallel from said PCB bearing surface.

6. The radiation-emitting semiconductor component according to claim 1, wherein said sealing sheath has at least one lateral inward bulge forming said PCB bearing surface; and said terminal leads are rectilinear and each has a side surface with a respective one of said soldering surfaces, said side surfaces disposed in said given plane with said PCB bearing surface.

7. The radiation-emitting semiconductor component according to claim 6, wherein said first and second head parts are disposed in said give plane.

8. The radiation-emitting semiconductor component according to claim 1, wherein said sealing sheath has a flat intake surface opposite said PCB bearing surface.

9. The radiation-emitting semiconductor component according to claim 1, wherein said sealing sheath has a cap-shaped lens opposite said bottom surface, said lens has said radiation exit surface, said radiation exit surface is curved, and said lens has an optical axis coinciding with said optical axis of said semiconductor body.

10. A radiation-emitting semiconductor component, comprising:

at least one semiconductor body transmitting radiation along an optical axis of the semiconductor component and having first and second electrical contacts;

a first electrical terminal part having a first head part and a first terminal lead with a first soldering surface in a given plane, said first head part electrically conductively connected to said first electrical contact;

a second electrical terminal part having a second head part and a second terminal lead with a second soldering surface in said given plane, said second head part electrically conductively connected to said second electrical contact; and an integral sealing sheath formed of a material at least partly permeable to the radiation and enclosing said semiconductor body and said first and second head parts, said sealing sheath having opposite sides and radiation exit and bottom surfaces each disposed at a respective one of said opposite sides, said first and second terminal leads protruding through said bottom surface out of said sealing sheath, said sealing sheath having two lateral inward bulges forming a first PCB bearing surface and one lateral flat surface forming a second PCB bearing surface, one of said PCB bearing surfaces disposed in said given plane;

whereby said sealing sheath and said electrical terminal parts form a housing to be surface-mounted on a PCB.

11. The radiation-emitting semiconductor component according to claim 10, wherein said semiconductor body transmits a cone of radiation.

12. A radiation-emitting semiconductor component, comprising:

at least one semiconductor body transmitting radiation and having first and second electrical contacts;

a first electrical terminal part having a first head part and a first terminal lead with a side surface, said first head part electrically conductively connected to said first electrical contact;

a second electrical terminal part having a second head part and a second terminal lead with a side surface, said second head part electrically conductively connected to said second electrical contact; and a sealing sheath formed integrally from a material at least partly permeable to the radiation and enclosing said semiconductor body and said first and second head parts, said sealing sheath having opposite sides and radiation exit and bottom surfaces each disposed at a respective one of said opposite sides;

said first and second terminal leads protruding through said bottom surface out of said sealing sheath, said first and second terminal leads having a U-shaped bend outside said sealing sheath defining length portions of said terminal leads extending along said sealing sheath toward said radiation exit surface, and said side surfaces disposed in a common plane in the vicinity of said length portions.

13. The radiation-emitting semiconductor component according to claim 12, wherein said sheath has a side opposite said common plane with an intake surface.

14. The radiation-emitting semiconductor component according to claim 12, wherein said sheath has a side facing toward said common plane with a flattened surface.

15. The radiation-emitting semiconductor component according to claim 12, wherein said radiation exit surface at said side of said sheath opposite said bottom surface is curved, a cap-shaped lens is disposed at said radiation exit surface, said at least one semiconductor body has an optical axis, and said lens has an optical axis coinciding with said optical axis of said at least one semiconductor body.

* * * * *